(12) United States Patent
Speldrich et al.

(10) Patent No.: US 10,837,812 B2
(45) Date of Patent: Nov. 17, 2020

(54) MINIATURE FLOW SENSOR WITH SHROUD

(71) Applicant: Honeywell International Inc., Morris Plains, NJ (US)

(72) Inventors: Jamie Speldrich, Freeport, IL (US); William Hoover, Plain City, OH (US); Richard C. Sorenson, Columbus, OH (US); Ian Bentley, New Ipswich, NH (US)

(73) Assignee: HONEYWELL INTERNATIONAL INC, Morris Plains, NJ (US)

( * ) Notice: Subject to any disclaimer, the term of this patent is extended or adjusted under 35 U.S.C. 154(b) by 75 days.

(21) Appl. No.: 16/184,711

(22) Filed: Nov. 8, 2018

(65) Prior Publication Data

US 2019/0137307 A1    May 9, 2019

Related U.S. Application Data

(60) Provisional application No. 62/584,005, filed on Nov. 9, 2017.

(51) Int. Cl.

| | |
|---|---|
| *G01F 1/20* | (2006.01) |
| *H05K 1/02* | (2006.01) |
| *G01F 1/00* | (2006.01) |
| *G01F 15/00* | (2006.01) |
| *G01F 1/72* | (2006.01) |
| *G01F 15/14* | (2006.01) |
| *G01F 1/684* | (2006.01) |

(52) U.S. Cl.
CPC ............... *G01F 1/20* (2013.01); *G01F 1/002* (2013.01); *G01F 15/00* (2013.01); *H05K 1/0272* (2013.01); *G01F 1/684* (2013.01); *G01F 1/72* (2013.01); *G01F 15/14* (2013.01); *H05K 2201/10151* (2013.01)

(58) Field of Classification Search
CPC ... G01F 1/68; G01F 1/20; G01F 15/00; G01F 1/00
See application file for complete search history.

(56) References Cited

U.S. PATENT DOCUMENTS

| | | |
|---|---|---|
| 3,559,482 A | 2/1971 | Baker et al. |
| 4,648,270 A | 3/1987 | Johnson et al. |
| 5,295,394 A | 3/1994 | Suzuki |
| 5,655,207 A | 8/1997 | Sugiyama et al. |
| 6,591,674 B2 * | 7/2003 | Gehman .............. G01F 1/6842 73/204.21 |
| 2002/0078744 A1 | 6/2002 | Gehman et al. |
| 2006/0101907 A1 | 5/2006 | Shajii et al. |

(Continued)

*Primary Examiner* — Jewel V Dowtin
(74) *Attorney, Agent, or Firm* — Seager Tufte & Wickhem LLP

(57) ABSTRACT

A flow sensor assembly including a top flowtube that defines an inlet port, an outlet port, and a main channel. An inlet flow channel fluidly may connect the inlet port of the flow sensor assembly to the main channel. An outlet flow channel fluidly may connect the main channel to the outlet port. The bottom flowtube may include a shroud which acts as a cover over an electronic circuit board. The shroud may eliminate a step, created by the flow sensor, to provide a continuous flow path over the sensor. The channels may be formed to utilize the entire footprint of the flow sensor assembly.

18 Claims, 10 Drawing Sheets

(56) References Cited

U.S. PATENT DOCUMENTS

| | | | |
|---|---|---|---|
| 2011/0247411 A1* | 10/2011 | Speldrich | B29C 45/0025 |
| | | | 73/273 |
| 2015/0362451 A1 | 12/2015 | Hunziker et al. | |
| 2016/0161314 A1* | 6/2016 | Hunziker | G01F 1/688 |
| | | | 73/204.21 |
| 2019/0137307 A1* | 5/2019 | Speldrich | G01F 1/002 |

* cited by examiner

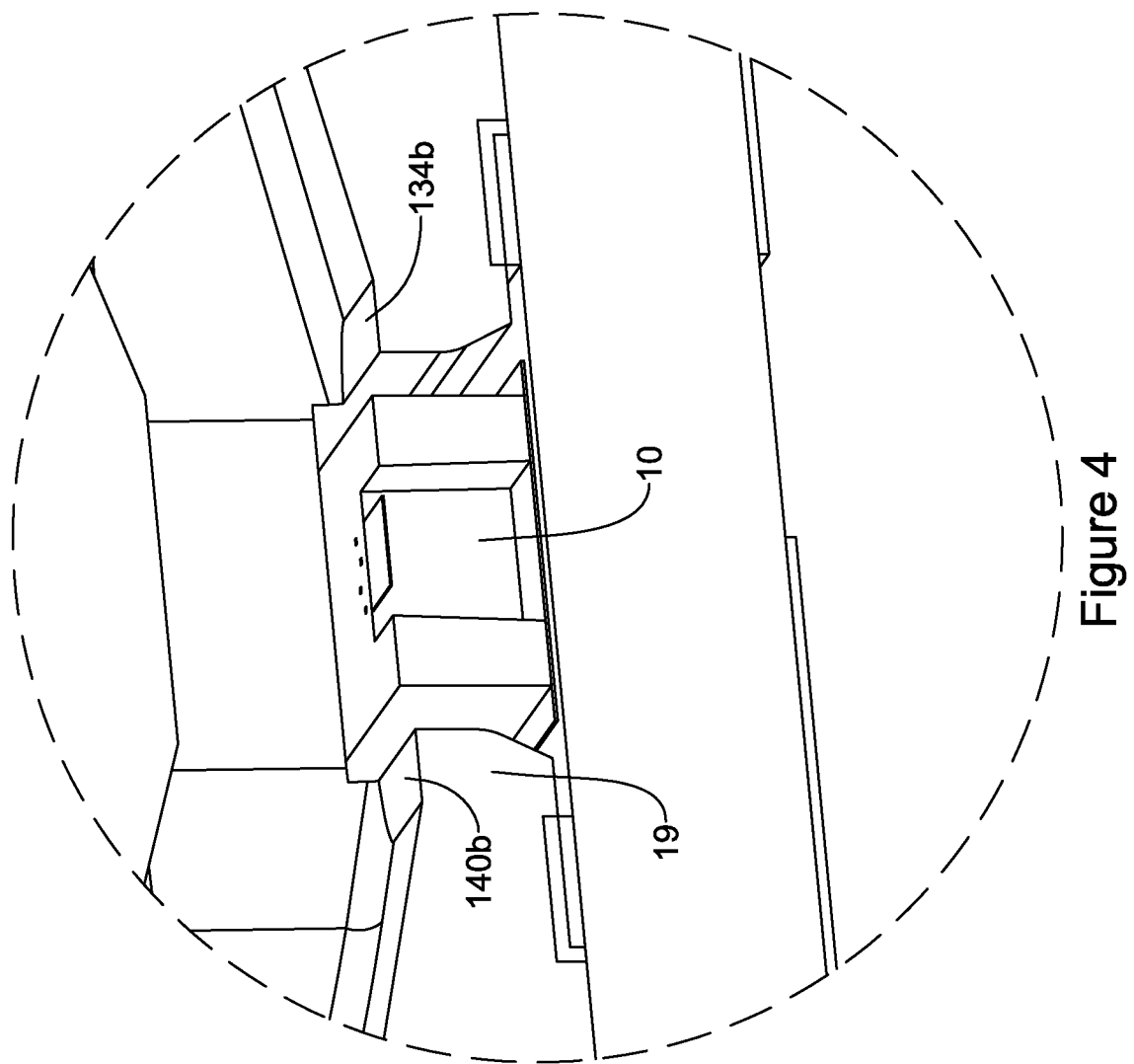

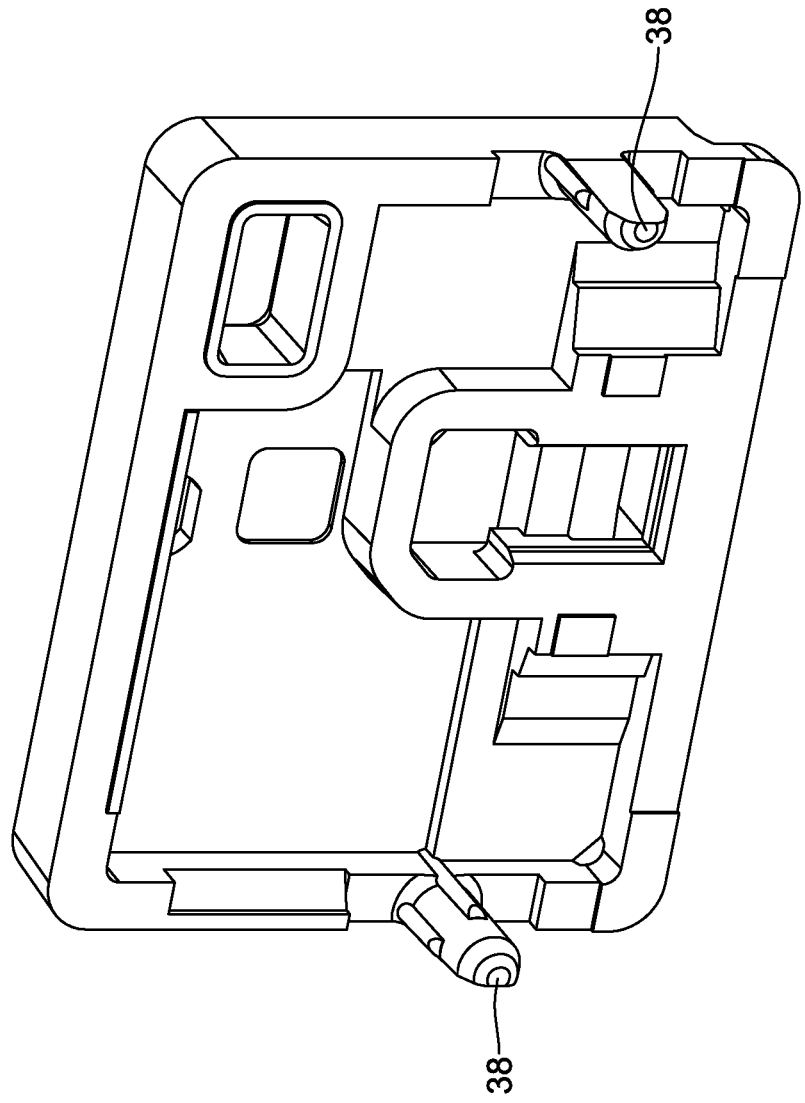

MINIATURE FLOW SENSOR WITH SHROUD

This application claims the benefit of U.S. Provisional Application 62/584,005, filed Nov. 9, 2017, entitled "Miniature Flow Sensor with Shroud". U.S. Provisional Application 62/584,005, filed Nov. 9, 2017, is hereby incorporated by reference.

BACKGROUND

Medical apparatus such as CPAP may be becoming smaller and portable which means that flow sensors are to become much smaller to meet a need of an application. But the smaller sensor footprint does not necessarily allow sufficient flow channel distance to fully laminarize a flow. That may make it difficult to provide a low noise, monotonic signal. In addition, flow sensors may be typically used in parallel (bypass) with a flow element. As flow sensors become smaller, the orifice type flow of small internal flow channels may lead to poor null performance in medical equipment.

The present device may use a two piece flowtube. A bottom flow tube may act as a cover over the electronic circuit board and also provide a shroud around the flow sensor to eliminate a step created by the sensor in the flow path. Eliminating the step may help reduce eddies (turbulence) and maintain laminar flow and best performance. The top flowtube may have molded-in channels. Since the channels may be formed over the cover and utilize the entire footprint, the flow can be laminarized with longer channels, radii can be maximized to reduce eddies and turbulence, and orifice effects can be reduced to insure best performance in bypass applications.

Sensors are used in a wide variety of applications including residential, industrial, automotive, military, medical, aeronautical, space, as well as many other applications. One particular type of sensor is a flow sensor for measuring a flow rate of a fluid. What would be desirable is a flow sensor that can operate across a relatively large pressure drop while retaining a small footprint.

SUMMARY

This disclosure relates generally to sensors such as flow sensors. An illustrative flow sensor may include a top flowtube that defines an inlet port and an outlet port. The top flowtube may define a main channel having an inlet flow channel and an outlet flow channel. An inlet flow channel may fluidly connect the inlet port of the flow sensor assembly to the main channel and an outlet flow channel may fluidly connect the main channel to the outlet port of the flow sensor assembly.

The flow sensor assembly may include a bottom flowtube containing a shroud covering the flow sensor. The flow sensor may be exposed to a fluid flow in the main channel and may be configured to sense a measure related to the flow rate of the fluid flowing through the main channel. The flow sensor assembly may have a mounting footprint of less than 200 mm$^2$.

The preceding summary is provided to facilitate an understanding of some of the features of the present disclosure and is not intended to be a full description. A full appreciation of the disclosure can be gained by taking the entire specification, claims, drawings, and abstract as a whole.

BRIEF DESCRIPTION OF THE DRAWING

The disclosure may be more completely understood in consideration of the following description of various illustrative embodiments of the disclosure in connection with the accompanying drawings, in which:

FIG. 4 is a perspective view of the shroud;

FIG. 6A is a perspective view of the underside of the bottom flowtube of FIG. 1;

Figure 1:
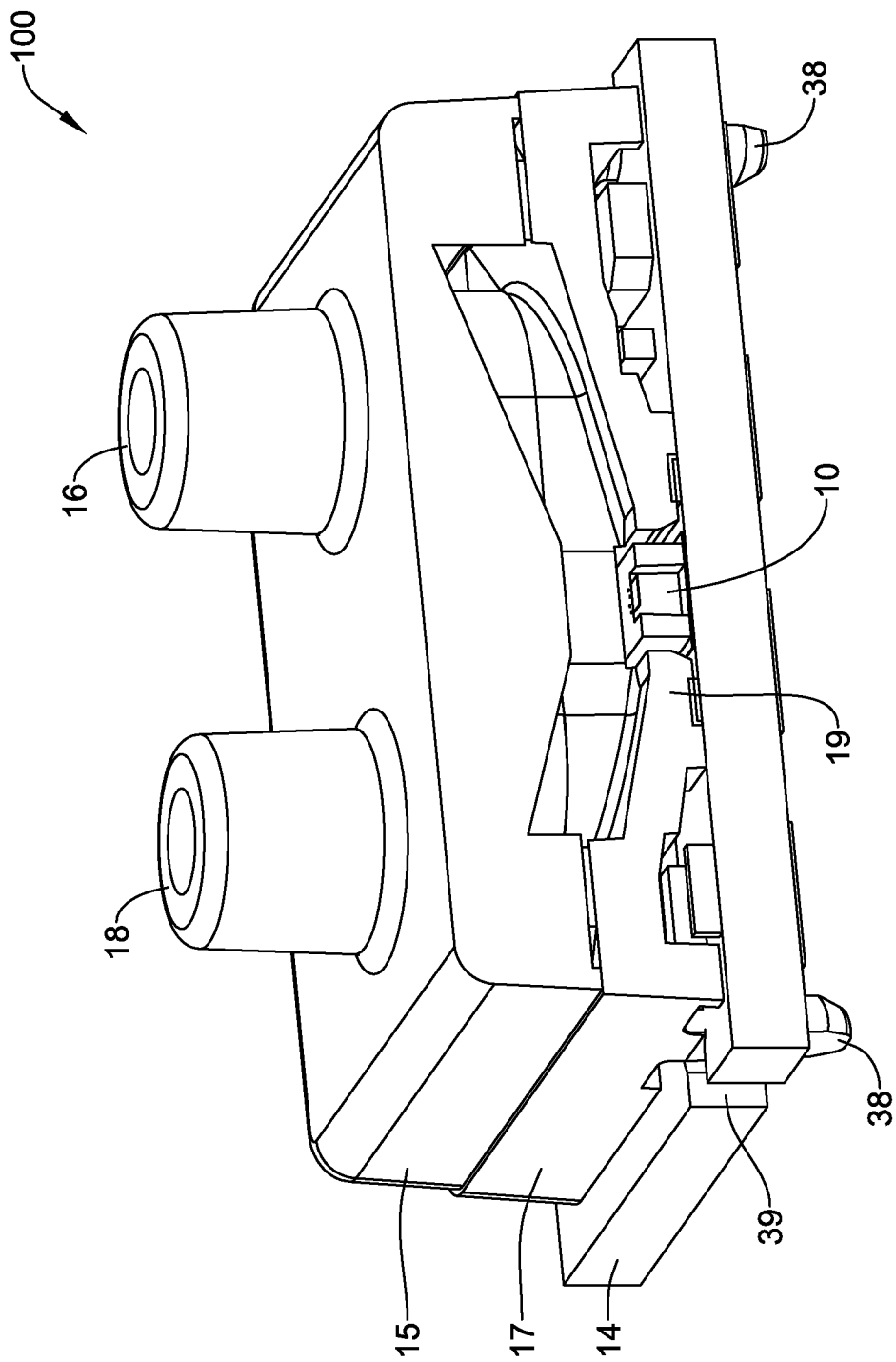
FIG. 1 is a perspective view of an illustrative flow sensor.

While the disclosure is amenable to various modifications and alternative forms, specific items thereof have been shown by way of example in the drawings and described in detail. It should be understood, however, that the intention is not to limit the disclosure to the particular illustrative embodiments described herein. On the contrary, the intention is to cover all modifications, equivalents, and alternatives falling within the spirit and scope of the disclosure.

DESCRIPTION

The present system and approach may incorporate one or more processors, computers, controllers, user interfaces, wireless and/or wire connections, and/or the like, in an implementation described and/or shown herein.

This description may provide one or more illustrative and specific examples or ways of implementing the present system and approach. There may be numerous other examples or ways of implementing the system and approach.

Aspects of the system or approach may be described in terms of symbols in the drawing. Symbols may have virtually any shape (e.g., a block) and may designate hardware, objects, components, activities, states, steps, procedures, and other items.

The following description should be read with reference to the drawings wherein like reference numerals indicate like elements throughout several view. References to "over," "under," "top," and "bottom," and so forth, are relative terms and are made herein with respect to the drawings and do not necessarily correspond to any particular orientation in actual physical space. The description and drawings show several examples that are meant to be illustrative in nature.

FIG. 1 is a perspective view of an illustrative flow sensor assembly 100 for measuring a fluid flow rate of fluid flow passing through a fluid channel. The term "fluid" as used herein can refer to a gas flow or a liquid flow or a liquid flow, depending on the application. While the flow sensor assembly 100 will be described herein as being a flow sensor 10, it will be appreciated that flow sensor assembly 100 may be any suitable type of sensor, including a pressure sensor, a thermal conductivity sensor, a temperature sensor, a humidity sensor, a chemical sensor, and/or any combination of these or other sensors. As seen in FIG. 1, the illustrative flow sensor assembly 100 includes a flow sensor 10, top flowtube 15, bottom flowtube 17 containing a shroud 19 and a circuit board 14. The top flowtube 15 defines a fluid inlet port 16 and fluid outlet port 18. It will be appreciated that in some cases, definition of which opening forms the fluid inlet port 16 and which forms the fluid outlet port 18 is arbitrary as in some cases the fluid channels within the top flowtube 15 to be discussed, may be symmetric and the flow sensor 10 may be capable of measuring flow rate equally well in flow direction.

Top flowtube 15, shroud 19, and circuit board 14 may be interconnected by locating features such as snaps, male/female connectors and magnets. As shown, bottom flowtube 17 with shroud 19 is connected to circuit board 14 by having the legs 38 fit snug within the slot 30 of circuit board 14. The flow sensor assembly 100 may have a footprint less than 200 mm$^2$.

Figure 2:
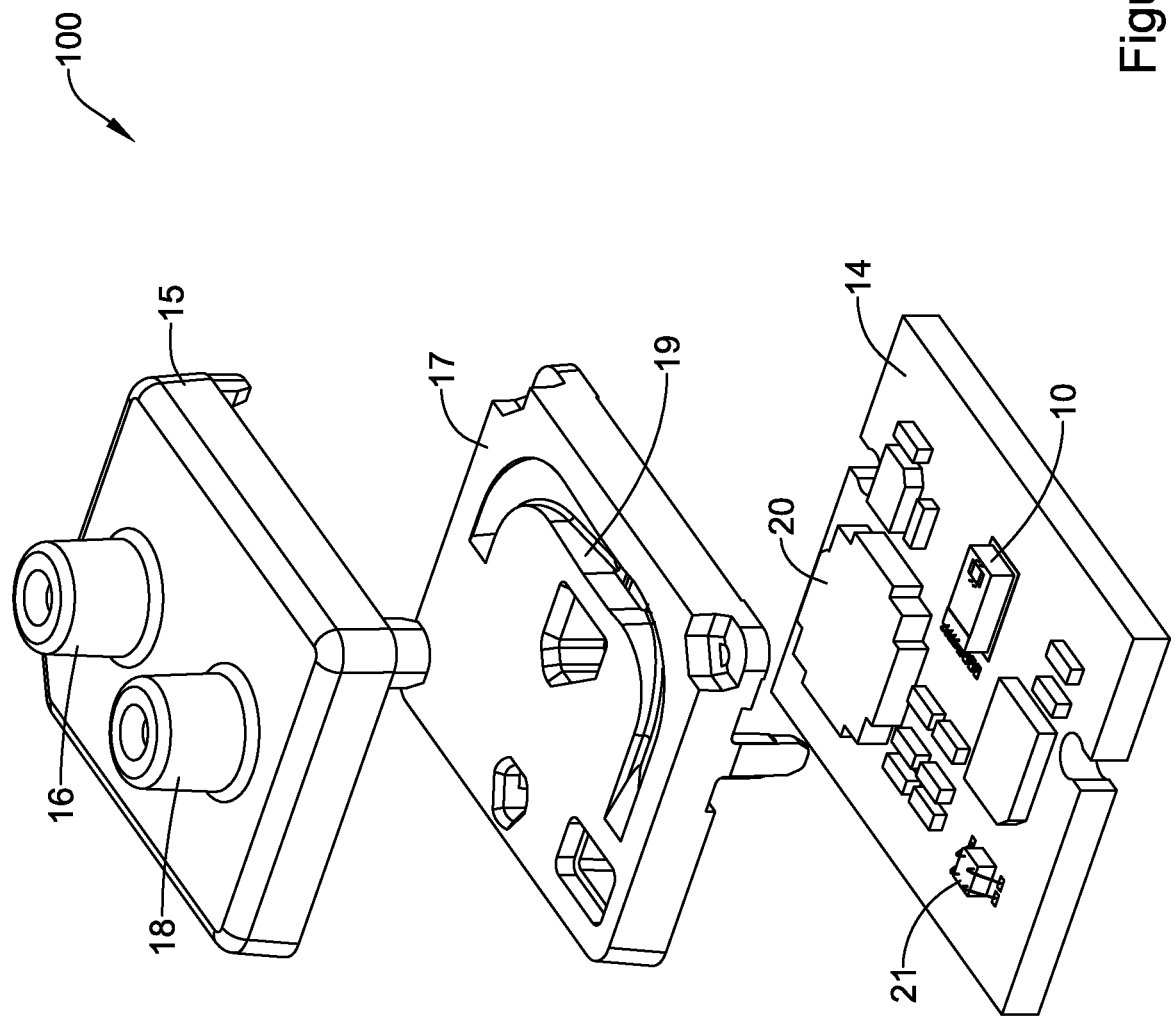
FIG. 2 is an exploded perspective view of the illustrative flow sensor of FIG. 1.

FIG. 2 is an exploded view of the illustrative flow sensor assembly 100 in which the top flowtube 15 has been moved away from the shroud 19 and the circuit board 14. It can be seen that the circuit board 14 includes at least a flow sensor 10, circuit 20 and a sense die 21. The circuit 20 may include whatever circuitry is appropriate to receive an electrical signal from the sense die 21 and to output a signal representative of whatever the flow sensor 10 is configured to sense, detect or measure. Circuit 20 may include one or more ICs or other electrical components, as appropriate. Moreover, it is contemplated that the circuit board 14 may have traces and/or adhesive for interconnecting various components on the circuit board 14.

Figure 3:
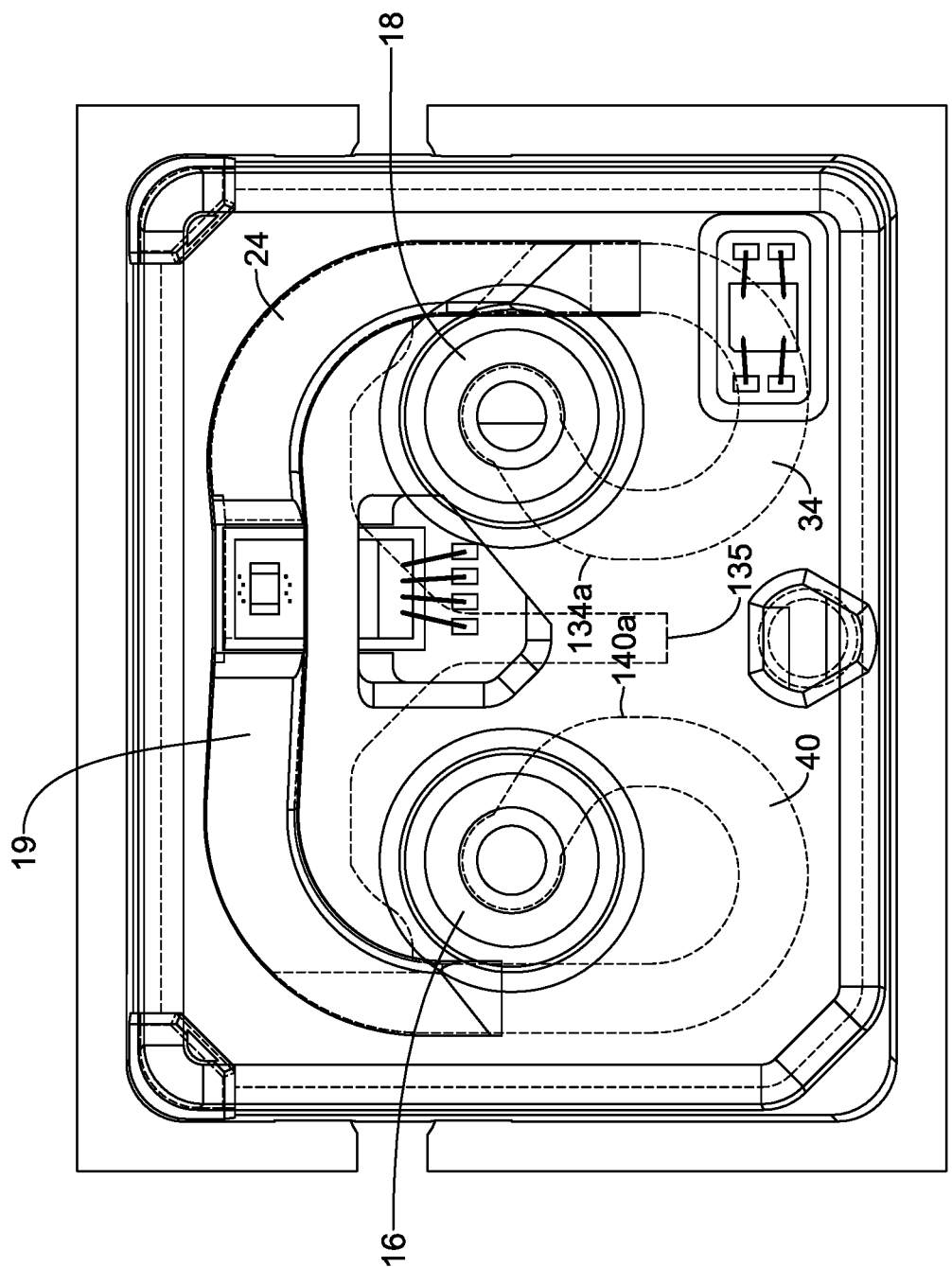
FIG. 3 is a top view of the two piece flowtube as it relates to FIG. 1.

FIG. 3 is a top down view of the flowpath of the channel as depicted in FIG. 1. Epoxy 135 may be placed on top surface of the shroud 19 to hold the top flowtube 15 in place. Likewise, epoxy 135 may be placed on the circuit board 14 to hold the shroud 19 in place. The top flowtube 15 defines a main channel having a inlet flow channel 34 and outlet flow channel 40 with a single bend, 134a and 140a, respectively. Fluid enters through the fluid inlet port 16 and exits through the fluid outlet port 18 via the main channel input 24. That is, the inlet flow channel 34 may be fluidly connected via the fluid inlet port 16 and to the main channel input 24. The inlet flow channel includes a single bend 134a. Similarly, the outlet flow channel 40 may includes a single bend 140a. There may be a height step up 134b and height step down 140b (FIG. 4) between the main channel 22. Flow channel length and cross section may be maximized in the two piece flowtube configuration. The longer length and larger cross-section help laminarize flow to ensure low noise and monotonic signal. Larger channels may also help reduce orifice effects to ensure the best null performance. When so provided, the flow sensor 10 may not be a "bidirectional" flow sensor that is independent of flow direction through the fluid inlet port 16 and the fluid outlet port 18.

FIG. 4 is detailed view of the shroud as it relates to FIG. 1. The bottom flowtube 17 may use a shroud 19 which reduces the height step up 134b and height step down 140b caused by the height of the flow sensor 10. Alternatively, the bottom flowtube 17 may use a shroud 19 to eliminate the step caused by the height of the flow sensor 10. That is, the shroud 19 may guide fluid flow over the flow sensor 10 and improve sensor performance by reducing eddies (turbulence). This may also make for a more repeatable process and a quieter flow sensor. The shroud 19 may include a small gap approximately 2 mm on each side of the flow sensor 10 and the walls of the shroud. The gap size depends on the size of the flow sensor 10 used within the flow sensor assembly 100.

Figure 5A:
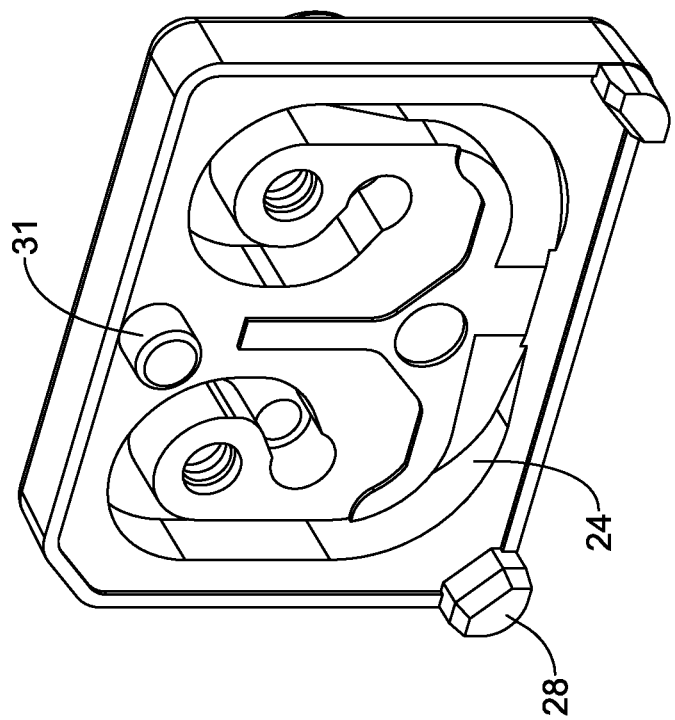
FIG. 5A is a perspective view of the inside of the top flowtube of FIG. 1.
Figure 5B:
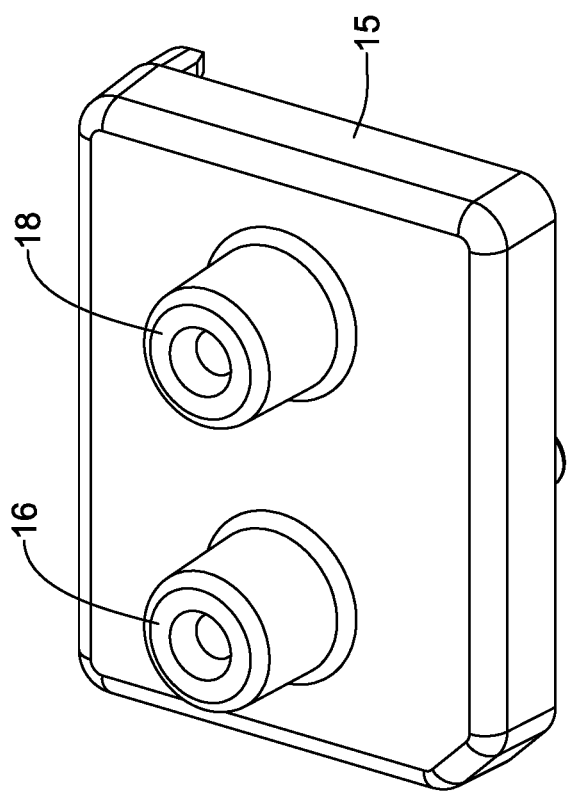
FIG. 5B is a perspective view of the an embodiment of the top flowtube of FIG. 1.
Figure 5C:
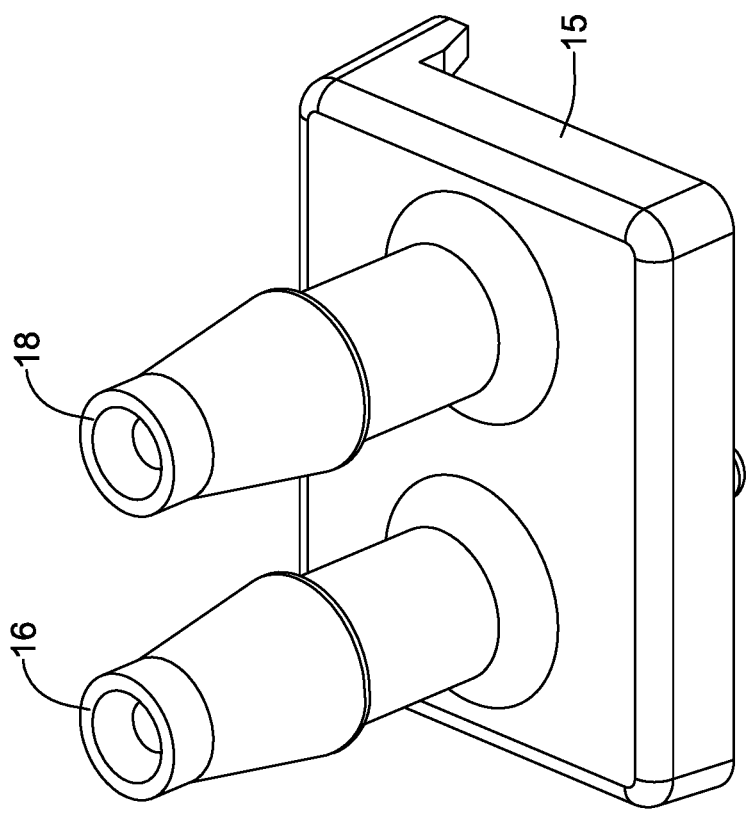
FIG. 5C is a perspective view of an alternate embodiment of the top flow tube of FIG. 1.

FIG. 5A-5C are perspective views of the top flowtube 15 of FIG. 1. The underside of the top flowtube 15 includes a continuos flow path molded-in main channel 22. The main channel 22 is connected via the inlet flow channel 34 to the outlet flow channel 40. Knob 31 may be included as locating means for the bottom flowtube 17. In the illustrative embodiment of FIG. 5B, the fluid inlet port 16 and fluid outlet port 18 are in a manifold setting. In the illustrative embodiment of FIG. 5C, the fluid inlet port 16 and fluid outlet port 18 are in a barbed port setting.

Figure 6B:
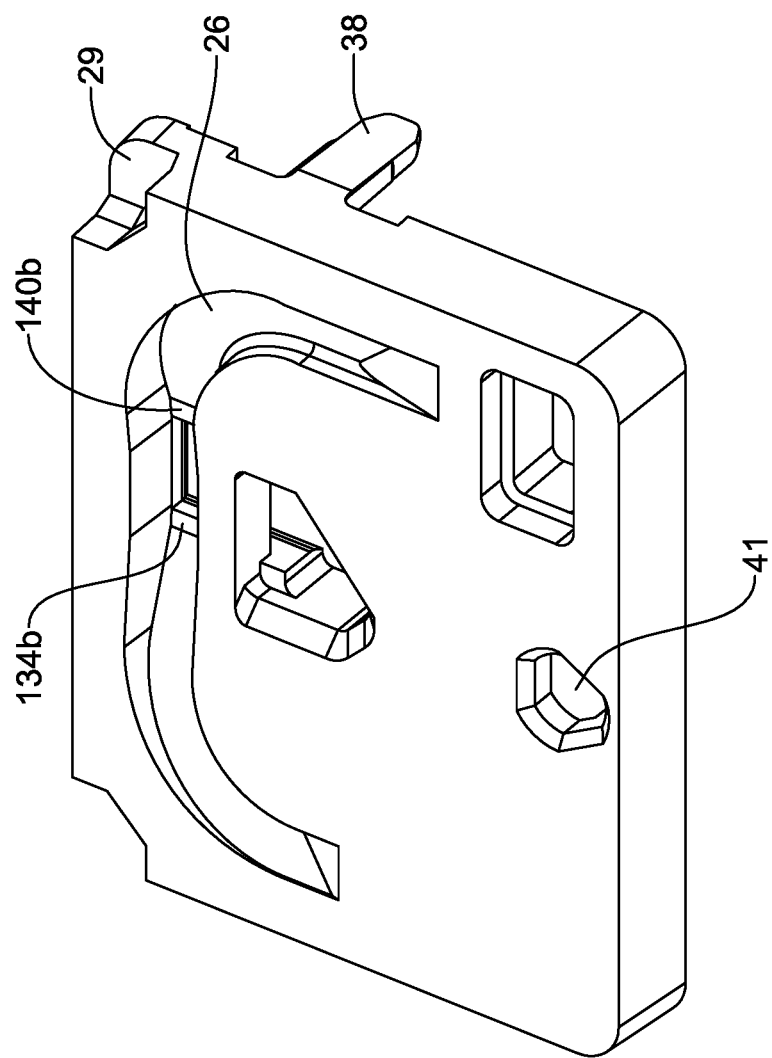
FIG. 6B is a perspective view of the topside of the bottom flowtube of FIG. 1.

FIG. 6A-6B are perspective views of the bottom flowtube 17 of FIG. 1. FIG. 6A shows the underside of the bottom flowtube 17. Hollow openings are set within the bottom flowtube to encompass connection to the flow sensor 10 and sense die 21. It is contemplated that additional openings may be contructed to consider other elements on the circuit board 14 as well. Legs 38 may be contructed to abut notches 39 in the circuit board 14. The topside of the bottom flowtube 17 may include an abbreviated channel 26 to mirror the epoxy that is placed from the top flowtube 15. The abbreviated channel 26 abuts to the main channel 22 of the top flowtube 15 to ensure a continuous flow. The abbreviated channel 26 may be molded in the top side of the bottom flowtube 17. The abbreviated channel 26 may have two sections, not continuous, to provide an opening for the flow sensor 10. Notches 29 may be inset in the bottom flowtube 17 to receive the legs 28 from the top flowtube 15. Knob hole 41 may be constructed to receive knob 31 from the top flowtube 15.

Figure 7:
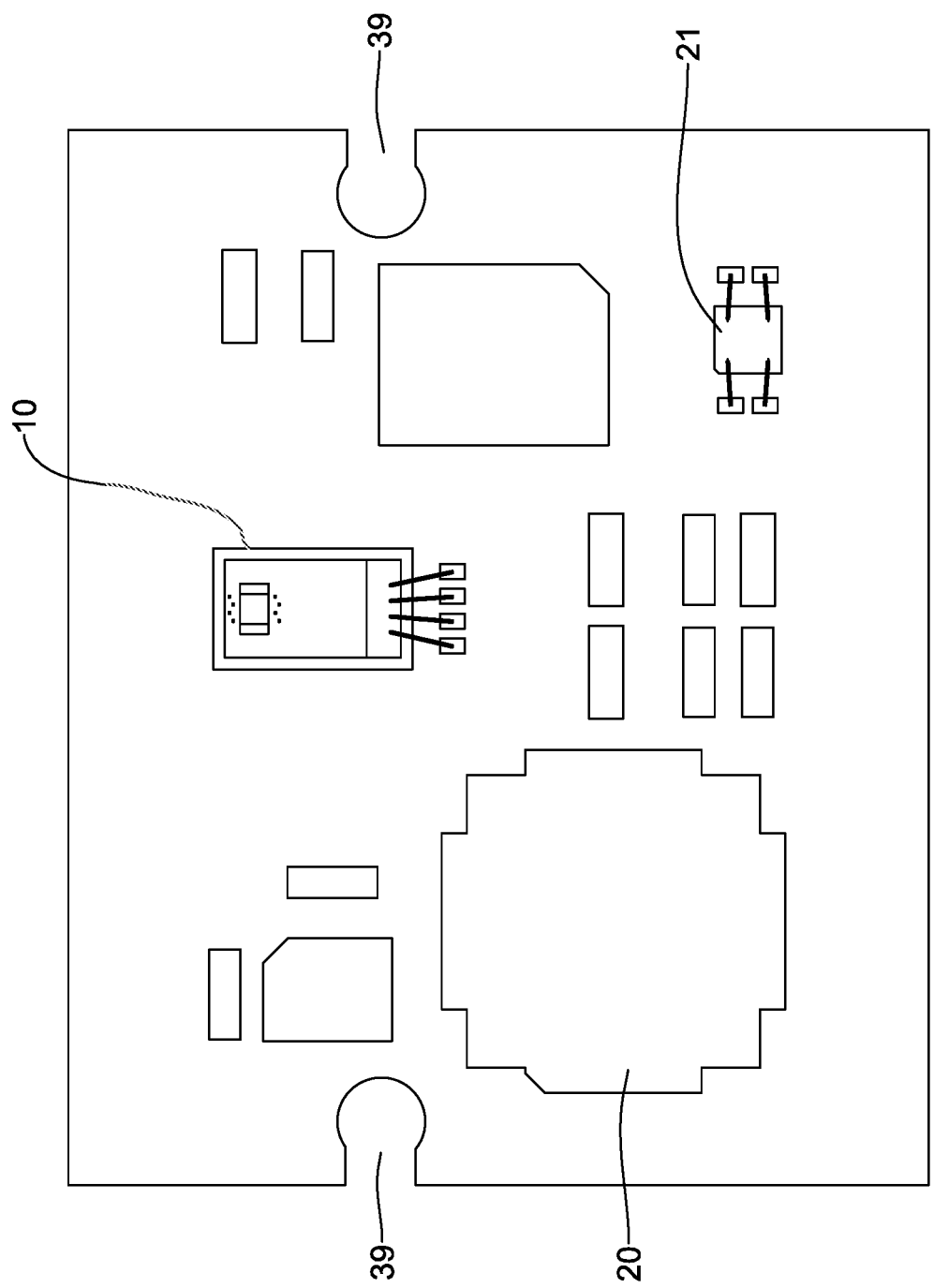
FIG. 7 is a perspective view of the circuit board of FIG. 1.

FIG. 7 is a perspective view of the circuit board 14. Notches 39 are shown as a means to receive the legs 38 from the bottom flowtube 17.

To recap, a flow sensor assembly may incorporate a housing defining an inlet port connected to an inlet flow channel, an outlet port connected to an outlet flow channel, a top flowtube, a bottom flowtube with a shroud, an electronic circuit board, and a sensor. The housing may be configured such that the top flowtube and the bottom flowtube are capable of being overlaid on the circuit board.

The flow sensor may have a footprint less than 200 mm$^2$.

The inlet port may feed into an inlet channel that follows a circuitous path with two or more bends.

The top flowtube may include molded-in channels.

The top flowtube channels may be formed over the bottom flowtube and utilize the entire footprint of the housing.

The bottom flowtube may act as a cover over the electronic circuit board.

The bottom flowtube may include a molded-in channel.

The shroud may contain walls located around the flow sensor.

The shroud may include a step less than the height of the flow sensor.

The bottom flowtube may have a gap between the flow sensor and walls of the bottom flowtube.

The flow channels may be maximized in a longitudinal direction and encompass a majority of the footprint of the flow sensor assembly.

A flow sensor may incorporate a top flowtube interconnected to a bottom flowtube which is interconnected to an electronic circuit board. The flow sensor may have a footprint less than 200 mm$^2$.

The top flowtube may include a flow channel and cross section area that are maximized in a longitudinal direction of the flow sensor.

The bottom flowtube may be overlaid onto the electronic circuit board.

An approach of minimizing the footprint of a flow sensor, may incorporate providing a housing to include an electronic circuit board, overlaying a bottom flowtube on the electronic circuit board, and assembling a top flowtube above the bottom flowtube. The top flowtube may include a molded-in flow channel.

The top flowtube may include an inlet port and an outlet port.

The bottom flowtube may include a shroud which covers the flow sensor.

The bottom flowtube may include a ramp which allows fluid to flow over the flow sensor.

The bottom flowtube may reduce the step caused by a height of the flow sensor.

The bottom flowtube may eliminate the step caused by the height of the flow sensor.

U.S. patent application Ser. No. 15/926,647, filed Mar. 20, 2018, is hereby incorporated by reference. Jul. 15, 2015, is hereby incorporated by reference. U.S. patent application Ser. No. 14/800,492, filed Jul. 15, 2015, is hereby incorporated by reference. U.S. Pat. No. 7,647,842, issued Jan. 19, 2010, is hereby incorporated by reference. U.S. Pat. No. 8,418,549, issued Apr. 16, 2013, is hereby incorporated by reference. U.S. Pat. No. 8,695,417, issued Apr. 15, 2014, is hereby incorporated by reference.

The disclosure should not be considered limited to the particular examples described above. Various modifications, equivalent processes, as well as numerous structures to which the disclosure can be applicable will be readily apparent to those of skill in the art upon review of the instant specification.

In the present specification, some of the matter may be of a hypothetical or prophetic nature although stated in another manner or tense.

Any publication or patent document noted herein is hereby incorporated by reference to the same extent as if each publication or patent document was specifically and individually indicated to be incorporated by reference.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include all such variations and modifications.

What is claimed is:

1. A flow sensor assembly, comprising:
a housing defining:
an inlet port connected to an inlet flow channel;
an outlet port connected to an outlet flow channel;
a top flowtube including the inlet port connected to the inlet flow channel and the outlet port connected to the outlet flow channel;
a bottom flowtube with a shroud;
an electronic circuit board; and
a flow sensor included in the electronic circuit board; and
wherein the housing is configured such that the top flowtube and the bottom flowtube are capable of being overlaid on the electronic circuit board; and
wherein the shroud includes a step less than a height of the flow sensor and the shroud is configured to guide fluid flow over the flow sensor and reduce turbulence.

2. The flow sensor assembly of claim 1, wherein the flow sensor has a footprint less than 200 mm$^2$.

3. The flow sensor assembly of claim 1, wherein the inlet port feeds into the inlet flow channel that follows a circuitous path with two or more bends.

4. The flow sensor assembly of claim 1, wherein the top flowtube includes molded-in channels.

5. The flow sensor assembly of claim 4, wherein the top flowtube channels are formed over the bottom flowtube and utilize the entire footprint of the housing.

6. The flow sensor assembly of claim 1, wherein the bottom flowtube acts as a cover over the electronic circuit board.

7. The flow sensor assembly of claim 6, wherein the bottom flowtube includes a molded-in channel.

8. The flow sensor assembly of claim 1, wherein the shroud contains walls located around the flow sensor.

9. The flow sensor assembly of claim 8, wherein the bottom flowtube has a gap between the flow sensor and walls of the bottom flowtube.

10. The flow sensor assembly of claim 1, wherein the inlet flow channel and the outlet flow channel are maximized in a longitudinal direction and encompass a majority of the footprint of the flow sensor assembly.

11. A flow sensor comprising:
a top flowtube interconnected to a bottom flowtube which is interconnected to an electronic circuit board; and
wherein the bottom flowtube includes a shroud and the electronic circuit board includes the flow sensor, and
wherein the shroud includes a step less than a height of the flow sensor and the shroud is configured to guide fluid flow over the flow sensor and reduce turbulence, and
wherein the flow sensor has a footprint less than 200 mm$^2$.

12. The flow sensor of claim 11, wherein the top flowtube includes a flow channel and cross section area that are maximized in a longitudinal direction of the flow sensor.

13. The flow sensor of claim 11, wherein the bottom flowtube is overlaid onto the electronic circuit board.

14. A method of minimizing a footprint of a flow sensor, comprising:
providing a housing to include an electronic circuit board, wherein the electronic circuit board includes the flow sensor;
overlaying a bottom flowtube on the electronic circuit board, wherein the bottom flowtube includes a shroud; and
assembling a top flowtube above the bottom flowtube; and
wherein the top flowtube includes a molded-in flow channel; and
wherein the shroud includes a step less than a height of the flow sensor and the shroud is configured to guide fluid flow over the flow sensor and reduce turbulence.

15. The method of claim 14, wherein the top flowtube includes an inlet port and an outlet port.

16. The method of claim 14, wherein the shroud covers the flow sensor.

17. The method of claim 14, wherein the bottom flowtube reduces the step caused by the height of the flow sensor.

18. The method of claim 14, wherein the bottom flowtube eliminates the step caused by the height of the flow sensor.

* * * * *